(12) United States Patent
Albrecht et al.

(10) Patent No.: US 11,177,421 B2
(45) Date of Patent: Nov. 16, 2021

(54) OPTOELECTRONIC COMPONENT

(71) Applicant: OSRAM OLED GmbH, Regensburg (DE)

(72) Inventors: Tony Albrecht, Bad Abbach (DE); Tamas Lamfalusi, Regensburg (DE); Christian Gatzhammer, Lupburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/993,791

(22) Filed: Aug. 14, 2020

(65) Prior Publication Data

US 2020/0381601 A1     Dec. 3, 2020

Related U.S. Application Data

(62) Division of application No. 16/097,769, filed as application No. PCT/EP2017/061215 on May 10, 2017, now Pat. No. 10,790,421.

(30) Foreign Application Priority Data

May 13, 2016    (DE) .................... 10 2016 108 931.1

(51) Int. Cl.
*H01L 33/00*     (2010.01)
*H01L 33/54*     (2010.01)
(Continued)

(52) U.S. Cl.
CPC .......... *H01L 33/54* (2013.01); *H01L 33/0093* (2020.05); *H01L 33/486* (2013.01);
(Continued)

(58) Field of Classification Search
CPC ...... H01L 33/54; H01L 33/486; H01L 33/502
See application file for complete search history.

(56) References Cited

U.S. PATENT DOCUMENTS 10,008,639 B2    6/2018    Göötz et al.
2005/0151147 A1    7/2005    Izuno et al.
(Continued)

FOREIGN PATENT DOCUMENTS

DE           102 50 911 A1    6/2004
DE    10 2007 006 171 A1    9/2007
(Continued)

OTHER PUBLICATIONS

Notice of Reasons for Rejection dated Dec. 10, 2019 of counterpart Japanese Application No. 2018-556428 with English translation.
(Continued)

*Primary Examiner* — Phuc T Dang
(74) *Attorney, Agent, or Firm* — DLA Piper LLP (US)

(57) ABSTRACT

An optoelectronic component includes an optoelectronic semiconductor chip including a connection surface; a first potting body; and a second potting body, wherein the first potting body covers all lateral side surfaces and the top surface of the semiconductor chip, the first potting body has a bottom surface flush with the connection surface, the second potting body has a bottom surface flush with the bottom surface, the second potting body completely covers all side surfaces of the first potting body facing away from the semiconductor chip, a top surface of the second potting body on the opposite of the connection surface is convexly curved, the first and second potting bodies have a contour in a lateral plane that is not similar, and the optoelectronic semiconductor chip has exclusively on its connection surface exposed electrical contact surfaces via which the semiconductor chip is electrically connectable and operable.

11 Claims, 5 Drawing Sheets

(51) Int. Cl.
  *H01L 33/50* (2010.01)
  *H01L 33/56* (2010.01)
  *H01L 33/48* (2010.01)

(52) U.S. Cl.
  CPC .......... *H01L 33/502* (2013.01); *H01L 33/56* (2013.01); *H01L 33/50* (2013.01); *H01L 2933/005* (2013.01); *H01L 2933/0041* (2013.01)

(56) References Cited

U.S. PATENT DOCUMENTS

| | | |
|---|---|---|
| 2008/0031009 A1 | 2/2008 | Kodaira et al. |
| 2012/0037929 A1 | 2/2012 | Ramchen et al. |
| 2012/0098005 A1* | 4/2012 | Chan .................. H01L 33/507 257/98 |
| 2013/0187178 A1 | 7/2013 | Tischler |
| 2013/0285096 A1* | 10/2013 | Tseng .................. H01L 33/502 257/98 |
| 2013/0313594 A1 | 11/2013 | Han et al. |
| 2014/0048824 A1 | 2/2014 | Hsieh |
| 2014/0285088 A1 | 9/2014 | Windisch |
| 2014/0319560 A1 | 10/2014 | Tischler |
| 2015/0364659 A1* | 12/2015 | Setlur .................. H01L 33/005 257/98 |
| 2016/0013373 A1 | 1/2016 | Bhat et al. |
| 2019/0157522 A1* | 5/2019 | Albrecht ............... H01L 33/486 |

FOREIGN PATENT DOCUMENTS

| | | |
|---|---|---|
| DE | 10 2007 053 067 A1 | 4/2009 |
| JP | 2005-183777 A | 7/2005 |
| JP | 2015-506591 A | 3/2015 |
| WO | 2015/124719 A1 | 8/2015 |

OTHER PUBLICATIONS

Notice of Reasons for Refusal dated Jun. 30, 2020 of counterpart Japanese Application No. 2018-556428 with English translation.
Notice of Allowance dated May 3, 2018, of counterpart Japanese Application No. 2018-556428, with English translation.
Certificate of Patent and Notification of Registration of Establishment of Patent Right dated Jul. 27, 2021, of Japanese Patent Application No. 2018-556428, along with an English translation.

* cited by examiner

OPTOELECTRONIC COMPONENT

RELATED APPLICATIONS

This is a divisional application of U.S. application Ser. No. 16/097,769 filed Oct. 30, 2018, now U.S. Pat. No. 10,790,421, which is a § 371 of International Application No. PCT/EP2017/061215, with an international filing date of May 10, 2017 (WO 2017/194620 A1, published Nov. 16, 2017), which is based on German Patent Application No. 201610108931.1, filed May 13, 2016, the subject matter of which is incorporated by reference.

TECHNICAL FIELD

This disclosure relates to an optoelectronic component and a method of producing an optoelectronic component.

BACKGROUND

There is a need to provide an optoelectronic component that can be produced in a particularly material-saving, simple and cost-efficient manner and to provide a corresponding method.

SUMMARY

We provide an optoelectronic component including an optoelectronic semiconductor chip including a connection surface, a cover surface opposite the connection surface and lateral side surfaces that connect the connection surface and the cover surface to one another; a first potting body; and a second potting body, wherein the first potting body covers all lateral side surfaces and the top surface of the semiconductor chip, the first potting body has a bottom surface flush with the connection surface of the semiconductor chip, the second potting body has a bottom surface flush with the bottom surface of the first potting body, the second potting body completely covers all the side surfaces of the first potting body facing away from the semiconductor chip, a top surface of the second potting body on the opposite of the connection surface is convexly curved, and the optoelectronic semiconductor chip has exclusively on its connection surface exposed electrical contact surfaces via which the semiconductor chip is electrically connectable and operable.

We also provide a method of producing an optoelectronic component including providing a carrier; placing a second mask on the carrier; arranging a first mask on the carrier so that the first mask covers the second mask; arranging optoelectronic semiconductor chips on the carrier in recesses of the first mask; applying a first encapsulation agent in the recesses of the first mask to form a first potting body; removing the first mask; applying a second encapsulation agent in recesses of the second mask to form a second potting body; and removing the second mask.

We further provide an optoelectronic component including an optoelectronic semiconductor chip including a connection surface, a cover surface opposite the connection surface and lateral side surfaces that connect the connection surface and the cover surface to one another; a first potting body; and a second potting body, wherein the first potting body covers all lateral side surfaces and the top surface of the semiconductor chip, the first potting body has a bottom surface flush with the connection surface of the semiconductor chip, the second potting body has a bottom surface flush with the bottom surface of the first potting body, the second potting body completely covers all side surfaces of the first potting body facing away from the semiconductor chip, a top surface of the second potting body on the opposite of the connection surface is convexly curved, the first and second potting bodies have a contour in a lateral plane that is not similar, and the optoelectronic semiconductor chip has exclusively on its connection surface exposed electrical contact surfaces via which the semiconductor chip is electrically connectable and operable.

Figure 1A:
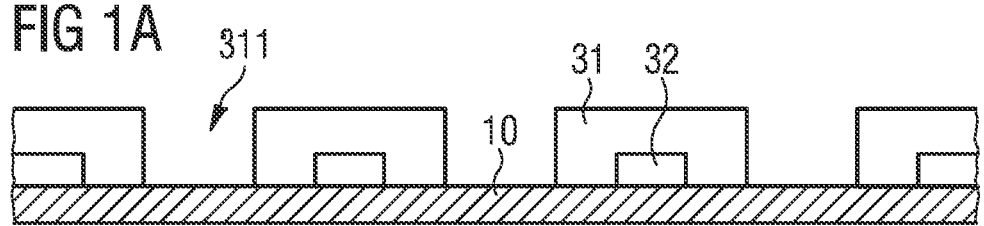
FIGS. 1A, 1B, 1C, 1D, 1E and 1F show schematic sectional views of various process steps of the manufacturing process of producing an optoelectronic component.

LIST OF REFERENCE SIGNS 1 optoelectronic component
10 carrier
100 semiconductor chip
100a top surface of the semiconductor chip
100b connection surface of the semiconductor chip
100c lateral side surface of the semiconductor chip
21 first potting body
21b bottom surface of the first potting body
22 second potting body
22a top surface of the second potting body
22b bottom surface of the second potting body
31 first mask
311 recess in the first mask
32 second mask
321 recess in the second mask

DETAILED DESCRIPTION

Our optoelectronic component is, for example, a radiation-emitting optoelectronic component. The optoelectronic component may be in particular a light emitting diode or a light-emitting module. During normal operation of the optoelectronic component electromagnetic radiation is generated and emitted by the optoelectronic component. In this example, it is possible for the optoelectronic component to generate electromagnetic radiation in a spectral range between UV radiation and infrared radiation, in particular visible light.

The optoelectronic component may comprise an optoelectronic semiconductor chip with a connection surface, a cover surface opposite the connection surface, and lateral side surfaces connecting the connection surface and the cover surface to one another. The semiconductor chip is, for example, a radiation-emitting semiconductor chip, for example, a LED chip adapted to generate electromagnetic radiation in normal operation.

The semiconductor chip may have at its connection surface at least one contact surface over which the semiconductor chip can be electrically contacted and operated. During operation, a large part of the electromagnetic radiation generated in the semiconductor chip emerges from the semiconductor chip through the cover surface opposite the connection surface.

The optoelectronic component may have a first potting body. The first potting body comprises, for example, a plastic material, in particular silicone, or consists of the material. Additionally, the first potting body may include at least one conversion agent. The conversion agent is designed to at least partially convert electromagnetic radiation generated in the semiconductor chip into electromagnetic radiation of a longer wavelength range. The conversion agent may be, for example, particles of a phosphor. Advantageously, the first potting body also has a protective function for the semiconductor chip so that the semiconductor chip is protected, for example, against mechanical and/or chemical damage by the first potting body.

The optoelectronic component may comprise a second potting body. In particular, the second potting body is formed with a transparent material, for example, with a plastic material, in particular silicone or consists thereof.

The first potting body may cover all lateral side surfaces and the top surface of the semiconductor chip, in particular completely. For example, the thickness of the first potting body on the lateral side surfaces of the semiconductor chip, measured perpendicular to the lateral side surfaces of the semiconductor chip, within the manufacturing tolerance is exactly the same as the thickness on the top surface, measured perpendicular to the top surface of the semiconductor chip. "Within the manufacturing tolerance" means that a deviation is at most 5%, in particular at most 1%.

The first potting body is in direct contact with the lateral side faces and the top surface of the semiconductor chip. In particular, the first potting body and the semiconductor chip are materially connected to each other without a further connector between them.

The first potting body may have a bottom surface terminating flush or substantially flush with the connection surface of the semiconductor chip. "Substantially flush" means that the first potting body with its bottom surface can project beyond the connection surface by the height of any connection points on the connection surface if the connection points do not terminate flush with the connection surface. For example, the bottom surface of the first potting body extends parallel to the connection surface of the semiconductor chip within the manufacturing tolerance. In particular, the bottom surface of the first potting body and the connection surface of the semiconductor chip are in the same plane within the manufacturing tolerance.

The second potting body may have a bottom surface flush with the bottom surface of the first potting body within the manufacturing tolerance. For example, the bottom surface of the second potting body extends within the manufacturing tolerance parallel to the connection surface of the first potting. In particular, the bottom surface of the first potting body and the bottom surface of the second potting body are within the manufacturing tolerance in the same plane. In the plan view of the connection surface of the semiconductor chip, the connection surface of the semiconductor chip in a lateral plane is completely surrounded by the bottom surface of the first potting body. The lateral plane is the plane extending parallel to the connection surface of the semiconductor chip.

The second potting body may completely cover all side surfaces of the first potting body facing away from the semiconductor chip. For example, the second potting body is in direct contact with the side surfaces of the first potting body facing away from the semiconductor chip. In particular, there is a cohesive connection between the first and the second potting body, which is free of a further connector between the two potting bodies and which may only be solved by destroying one of the two potting bodies. In the plan view of the connection surface of the semiconductor chip, the bottom surface of the first potting body is completely surrounded by the bottom surface of the second potting body in a lateral plane.

A cover surface of the second potting body lying opposite the connection surface may be convexly curved. The top surface of the second potting body is the surface through which a major part of the electromagnetic radiation generated during operation of the optoelectronic component exits the optoelectronic component. In this connection, convexly curved means, for example, that the center of the radius of curvature of the convexly curved surface is on the side of the top surface facing the optoelectronic semiconductor chip.

The optoelectronic component may comprise an optoelectronic semiconductor chip having a connection surface, a top surface opposing the connection surface and lateral side surfaces connecting the connection surface and the top surface to each other. Furthermore, the optoelectronic component comprises a first potting body and a second potting, wherein the first potting body covers all lateral side surfaces and the top surface of the semiconductor chip. The first potting body has a bottom surface terminating flush with the connection surface of the semiconductor chip. The second potting body has a bottom surface terminating flush with the bottom surface of the first potting body. The second potting body completely covers all side surfaces of the first potting body facing away from semiconductor chip. A top surface of the second potting body on the opposite side of the connection surface is convexly curved.

One of the optoelectronic components is based, inter alia, on the following considerations. To protect optoelectronic components from environmental influences, these include, for example, a potting or a protective element of a different type forming at least part of the surfaces exposed to the outside of the optoelectronic component. The potting can be formed such that, besides the protection of the component it fulfills further functions. These functions may be related to, for example, optical properties of the optoelectronic component.

The optoelectronic component makes use, inter alia, of the idea of forming the potting from a first and a second potting body, each having different optical properties, for example, to realize different optical functions.

Advantageously, the first and the second potting body may be fabricated in separate and individually optimized process steps so that the entire optoelectronic component can be manufactured particularly efficiently and in a material saving manner.

The optoelectronic component may comprise a carrier, which is in direct contact with the first potting body and the second potting body in places, wherein the carrier connects to the first potting body and the second potting body without any connection agent. The carrier may be, for example, a printed circuit board (PCB), a metal core board, a ceramic carrier, or a so-called quad-flat no-lead package (QFN).

In particular, the carrier is in direct contact with the bottom surface of the first and second potting body. Furthermore, the carrier is arranged on the connection surface of the optoelectronic semiconductor chip. For example, the carrier may comprise electrical contact structures, printed conductors and/or further components by which the optoelectronic component can be electrically contacted and operated. In this example, contact surfaces of the semiconductor chip are in direct contact with the contact structures of the carrier. The contact surfaces of the semiconductor chip may project the contact surfaces perpendicular to their main extension plane beyond the connection surface of the semiconductor chip. In particular, a cohesive connection can exist between the carrier and the semiconductor chip. The cohesive connection may comprise a connection agent, in particular, an electrically conductive adhesive or a solder. Advantageously the electrical and mechanical connection between the semiconductor chip and the carrier is protected from environmental influences since the bottom surfaces of the first and second potting body are in direct contact with the carrier and the bottom surfaces of the first and second potting completely surround the connection surface of the semiconductor chip in a lateral plane.

The optoelectronic semiconductor chip, the first potting body and the second potting body may be freely accessible on a lower side of the optoelectronic component. In particular, the connection surface of the semiconductor chip and the bottom surfaces of the first and second potting body are exposed to the outside at least in places. Thus, the optoelectronic component can be arranged with the underside on a support to be contacted and operated via this in an electrically conductive manner. For example, the carrier may also serve as a heat sink for the optoelectronic component.

The semiconductor chip may have exclusively on its connection surface exposed electrical contact surfaces via which the semiconductor chip can be electrically contacted and operated. In particular, the semiconductor chip is then a surface-mountable semiconductor chip, for example, a flip-chip which contact surfaces lie on the opposite side of the side through which a major part of the electromagnetic radiation generated in operation is emitted. Advantageously, the contact surfaces of the semiconductor chip are not electrically contacted by a bonding wire, but can be arranged directly on an electrically conductive structure.

The second potting body may be clear. "Clear" means that electromagnetic radiation, when run through the second potting body, is only modestly reflected, absorbed or scattered. Advantageously the clear second potting body with the convexly curved top surface functions as an optical lens for electromagnetic radiation generated in operation of the semiconductor chip. By the second potting thus the efficiency can be increased, by which the electromagnetic radiation from the optoelectronic component is coupled out.

The first potting body may be in direct contact with the semiconductor chip. Specifically, the first potting body is in direct mechanical contact with the lateral side surfaces and the top surface of the semiconductor chip. The first potting body and the semiconductor chip are materially interconnected without another connecting agent. The mechanical connection between the semiconductor chip and the potting body can be solved only by destroying one of the two.

The first and the second potting bodies may connect to one another without connecting agent. The first and the second potting body have a material connection to each other that can be solved only by destroying one of the pottings. Both the first potting body and the second potting body comprise a plastic material such as silicone that enters into a material bond. Advantageously, no further material such as an adhesion promoter or an adhesive must be arranged in the beam path of the light emitted by the semiconductor chip radiation that reflects a portion of the radiation or could absorb.

The first and second potting bodies may have a contour in the lateral plane which is not similar. In the plan view of the connection surface of the optoelectronic semiconductor chip, the contour of the second potting body can completely surround the contour of the first potting body in the lateral plane. The contour of the first potting body is defined by the lateral side surfaces of the first potting body that connect the bottom surface and the opposite top surface of the first potting body. The contour of the second potting body is defined by the lateral side surfaces of the second potting body that connect the bottom surface and the opposite top surface of the second potting body.

If the contour of the first cast body and the second potting body are not similar to each other, the contours may not be transferred into one another by similarity transformations. That is, there is no geometric transfer that can be composed of central dilations and congruent transformations, i.e., translations, rotations and reflections that enables a transfer of one contour to another.

Advantageously, the contour of the first potting body can differ not only in their size, but also in their geometric shape. As a result, the optical properties in each of the first and second potting bodies can be controlled separately from each other.

Furthermore, we provide a method of producing an optoelectronic component. With the method, in particular, our optoelectronic component can be produced. That is, all the features disclosed for the optoelectronic component are also disclosed for the method and vice versa.

The method of producing an optoelectronic component relates in particular to the production of a radiation-emitting optoelectronic component. The optoelectronic component is designed to generate optoelectronic radiation in the visible wavelength range, between UV radiation and infrared radiation, during normal operation.

A carrier may first be provided. The carrier may be, for example, a foil, a printed circuit board, a metal core board, a ceramic carrier, or a Quad-Flat-No-Leads-Package (QFN).

In a further method step, a second mask is arranged on the carrier. The second mask has recesses that completely penetrate the second mask perpendicular to its main extension plane. The recesses are arranged at the corner points of a regular grid within the manufacturing tolerance in the lateral plane extending parallel to the main extension plane of the second mask. The recesses in the lateral plane can have any polygonal and/or round contours.

The second mask is self-supporting and can, for example, include a polymer, a ceramic or a metal, in particular, the second mask may comprise stainless steel, or consist of it. In addition, the second mask may have a coating, in particular a coating of Teflon. Advantageously, the coating is designed to reduce the risk of adhesion of the second potting body to the second mask.

In a further method step, a first mask is arranged on the carrier so that the first mask covers the second mask. The first mask has recesses that completely penetrate the first mask perpendicular to its main plane of extension. Within the manufacturing tolerances, the recesses are arranged at the vertices of a regular grid in the lateral plane extending parallel to the main extension plane of the first mask. The recesses may have any polygonal and/or round contours in the lateral plane.

The first mask is designed to be self-supporting and can comprise, for example, a polymer, a ceramic or a metal, in particular, the first mask may comprise stainless steel, or consist of it. In addition, the first mask may have a coating, in particular a coating of Teflon. Advantageously, the coating is designed to reduce the risk of adhesion of the first potting body to the first mask.

In addition, the first mask has an area in which the second mask can be inserted into the first mask. The first mask is placed on the second mask so that the first mask covers in this area exposed outer surfaces of the second mask. Exposed outer surfaces are the surfaces of the second mask not in direct contact with the carrier. In particular, the first mask completely covers the second mask at least in the region of the recess.

When arranging the first mask on the second mask, the first and the second mask are at least in places in direct contact with each other. For example, the first mask is aligned relative to the carrier by the second mask. In particular, the first mask is aligned relative to the second mask such that the recesses of the first mask lie in the lateral plane within the recesses of the second mask. The first and the second mask each have a bottom surface in direct contact with the carrier.

In a further method step, optoelectronic semiconductor chips are arranged on the carrier in recesses of the first mask. In particular, precisely one semiconductor chip is arranged each in a recess of the first mask. The semiconductor chips are, in particular, radiation-emitting semiconductor chips that emit light in the visible wavelength range during normal operation.

The optoelectronic semiconductor chips are completely surrounded by the first mask after being arranged on the carrier in the lateral plane. In particular, the first mask projects beyond the semiconductor chips perpendicular to the main extension plane of the first mask. The optoelectronic semiconductor chips are not in direct mechanical contact with the first mask. In particular, the distance in the lateral plane between the side surfaces of the optoelectronic semiconductor chip and the side surface of the first mask facing the corresponding side surface is the same, within the manufacturing tolerance.

In a further method step, a first encapsulation agent is applied in the recesses of the first mask, to form a first potting body. The encapsulation agent comprises a base material, for example, silicone and a conversion agent. The first encapsulation agent is initially liquid and cured to form the first potting body. The conversion agent may comprise, for example, particles in particular particles of a phosphor.

The first encapsulation agent is applied in the recesses of the first mask such that the thickness, measured perpendicular to the top surface of the semiconductor chip and measured perpendicular to the lateral side surfaces of the semiconductor chip is equal within the manufacturing tolerances. For example, the first encapsulation agent is applied by doctoring, casting or screen printing.

In a further method step, the first mask is removed. The first mask is non-destructively removed from the carrier so that it can be reused after removal from the carrier. For example, the first mask is removed by pulling apart the first mask and the carrier or the first and the second mask. Alternatively, the first mask is removed from the carrier by a brush-shaped tool. The brush-shaped tool has raised structures arranged laterally next to each other at a distance from each other of the recesses of the first mask. To remove the first mask, the raised structures are pressed onto the surfaces of the first potting body opposite the carrier in the recesses of the first mask. In this example, the first mask is fixed in the direction of pressing.

In a further method step, a second encapsulation agent is applied in the recesses of the second mask to form a second potting body. The second encapsulation agent comprises a plastic material, in particular silicone. The second encapsulation agent is clear so that electromagnetic radiation is only slightly absorbed, reflected or scattered.

The second encapsulation agent is initially liquid and cured to form the second potting body. The second encapsulation agent is applied, for example, by casting, spraying or dispensing. For example, the second encapsulation agent is applied such that the top surface of the second potting body has a convex curvature over the top surface of the optoelectronic semiconductor chip. The second encapsulation agent has, for example, non-wetting properties for the surface of the second mask so that the second potting body can be applied such that it projects beyond the side of the second mask facing away from the substrate and forms a convex meniscus. Advantageously, the radius of curvature of the convexly curved top surface can be adjusted by the wetting properties of the second encapsulation agent on the second mask. An increase in the contact angle between the second encapsulation agent and the second mask reduces the radius of curvature of the convexly curved top surface of the second potting body.

In a further method step, the second mask is removed. The second mask is nondestructively removed from the carrier so that it can be reused after removal from the carrier. For example, the second mask is removed by pulling apart the second mask and the carrier. Alternatively, the first mask is removed from the carrier by a brush-shaped tool. The brush-shaped tool has raised structures arranged laterally next to each other at a distance from each other of the recesses of the second mask. To remove the second mask, the raised structures are pressed onto the cover surfaces of the second potting body opposite the carrier in the recesses of the first mask. In this example, the second mask is fixed against the direction of pressing.

In a further method step, the optoelectronic semiconductor chips are singulated along at least part of the trenches formed by a lattice structure of the second mask in the second potting body. The optoelectronic semiconductor chips are singulated, for example, by severing the carrier. Alternatively, the optoelectronic semiconductor chips can be separated by detaching the carrier from the optoelectronic semiconductor chips and the first and second potting bodies. Advantageously, the carrier may be a film so that the optoelectronic components are separated by pulling off the film.

In particular, after singulation, two or more semiconductor chips may be mechanically connected to one another. In this example, an optoelectronic component comprises two or more semiconductor chips. In this example, each semiconductor chip is assigned exactly one first potting body and exactly one second potting body. Thus, each individual semiconductor chip has a convexly curved top surface uniquely assigned to it.

In a further method step, the carrier is removed. The carrier may be removed prior to removal of the second mask or after removal of the second mask. The carrier can be removed mechanically, for example, by pulling it off the optoelectronic semiconductor chips and the first and second potting bodies. In particular, the carrier is then a film.

The recess in the first mask need not be similar to the recesses in the second mask. If the contour of the recesses of the first mask and the contours of the second mask are not similar to one another, the contours cannot be converted into one another by similarity transformations. That is, there is no geometric transformation that can be composed of central dilations and congruent transformations, i.e., translations, rotations and reflections, which transforms one contour onto another contour. For example, the recesses in the first mask in the lateral plane may have a contour which is polygonal, in particular quadrangular, wherein the recesses of the second mask in the lateral plane have a round contour.

The second potting material in the liquid state may be non-wetting for the material of the second mask. The contact angle between the second potting material and the material of the second mask is therefore greater than 90°. Advantageously, by adjusting the contact angle between the second mask and the second potting material, the convex curvature of the top surface of the second potting body can be adjusted.

Further advantages and advantageous refinements and further developments of the optoelectronic component and of the method of producing the optoelectronic component will become apparent from the following examples illustrated in conjunction with the figures.

Same, similar or equivalent elements are provided in the figures with the same reference numerals. The figures and the proportions of the elements shown in the figures to each other are not to be considered to scale. Rather, individual elements may be exaggerated in size for better representability and/or better intelligibility.

FIGS. 1A to 1F show based on schematic sectional views an example of a process for the fabrication of an optoelectronic component.

A first method step of a method is explained in more detail with reference to FIG. 1A. In this example, a second mask 32 and then a first mask 31 are first arranged on a carrier 10. In the region of recesses 311 of the first mask 31, the carrier 10 is free of the first 31 and the second mask 32 and is freely accessible on its upper side facing the masks 31, 32. The second mask 32 is covered by the first mask 31 on all sides not covered by the carrier 10. The first mask 31, the second mask 32 and the carrier 10 are in direct mechanical contact with each other. The second mask 32 can be inserted in a designated area of the first mask 31 so that both the first mask 31 and second mask 32 are in direct contact with the carrier 10.

Figure 1B:
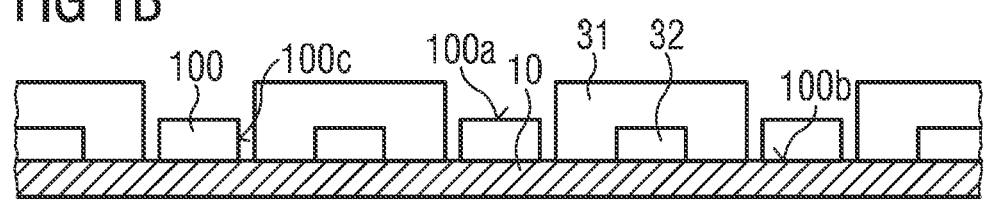

A second method step of a method is explained in more detail with reference to FIG. 1B. In this example, optoelectronic semiconductor chips 1 are arranged in the recesses 311 of the first mask 31. The semiconductor chips 100 materially connect to the carrier 10. The carrier 10 may have contact structures, via which the semiconductor chips 100 can be electrically conductively contacted and operated. The semiconductor chips 100 are arranged on the carrier 10 with their connection side 100b. That is to say, the semiconductor chips 100 are surface-mountable chips, for example, flip-chips that can be contacted and operated exclusively from their connection side 100b.

Specifically, the semiconductor chips 100 are arranged such that the distance between the side surfaces 100c of the optoelectronic semiconductor chip 100 and the first mask 31 in the lateral plane are equal to all sides and the optoelectronic semiconductor chip 100 is not in direct mechanical contact with the first mask 31.

Figure 1C:
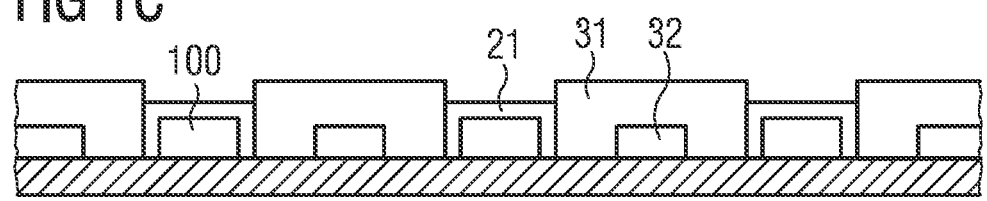

A third method step of a method is explained in more detail with reference to FIG. 1C. In this example, the first potting bodies 21 are arranged in the recesses 311 of the first mask 31. The first potting bodies 21 are respectively arranged on side surfaces 100c and top surfaces 100a of the optoelectronic semiconductor chips 100 and connected cohesively. The lateral extents of the first potting bodies 21 are predetermined by the contour of the recesses 311 of the first mask 31. For example, the encapsulation agent of the first potting body 21 is arranged such that a thickness of the first potting body 21 on the top surface 100a of the semiconductor chip 100, measured perpendicular to the top surface 100a of the semiconductor chip, and a thickness on the lateral side surfaces 100c, measured perpendicular to the lateral side surfaces 100c, is the same.

The first potting bodies 21 comprise, for example, silicone and a conversion agent. The conversion agent is designed to convert electromagnetic radiation generated in the semiconductor chips 100 into electromagnetic radiation of a longer wavelength range.

Figure 1D:
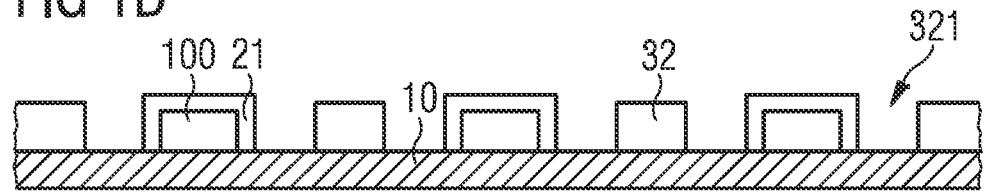

A fourth method step of a method is explained in more detail with reference to FIG. 1D. Therein the first mask 31 is removed. In particular, the first mask 31 is removed non-destructively and can be reused. After removing the first mask 31, the areas of the second mask 32 not covered by the carrier 10 are freely exposed. The carrier 10 is freely accessible within recesses 321 of the second mask 32 in regions in which the optoelectronic semiconductor chip 1 and the first potting body 21 are not arranged.

Figure 1E:
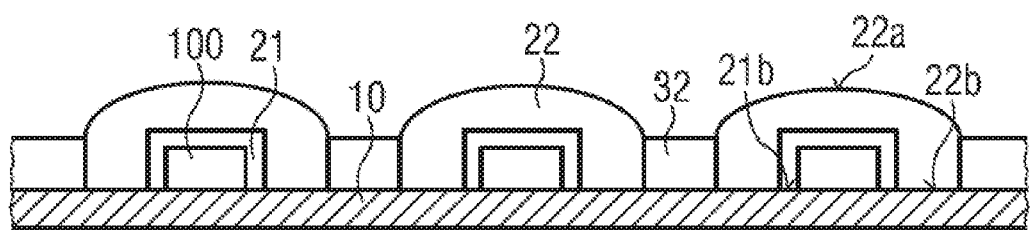

A fifth method step of a method is explained in more detail with reference to FIG. 1E. Thereby, second potting bodies 22 are arranged in the recesses 321 of the second mask. The second potting body 22 projects the second mask 32 on the side facing away from the carrier 10. On the side facing away from the carrier, top surfaces 22a of the second potting bodies 22 are convexly curved. The second potting bodies 22 each cover all the surfaces of the first potting bodies 21 facing away from the semiconductor chip 100 and are connected directly to these each cohesively. Bottom surfaces 22b of the second potting bodies terminate flush with bottom surfaces 21b of the first potting bodies 21. In the lateral plane the extension of the second potting bodies 22 through the second mask 32 is limited.

The second potting bodies 22 comprise, for example, silicone and are formed clear. In particular, the second potting bodies 22 are transparent for the electromagnetic radiation of the optoelectronic component.

Figure 1F:
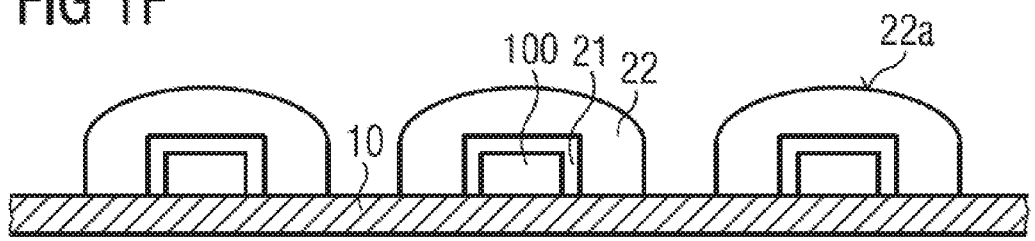

A sixth method step of a method is explained in more detail with reference to FIG. 1F. Thereby, the second mask 32 is removed. In particular, the second mask 32 is not damaged or destroyed in the removal. After the removal of the second mask 32, the carrier 10 has exposed areas on the side facing the optoelectronic semiconductor chips 100. For example, in a subsequent step, the optoelectronic semiconductor chips 100 can be separated along these exposed regions by severing the carrier 10 or detaching the carrier 10. In particular, the semiconductor chip 100 may be separated along solely some of these exposed regions so that an optoelectronic component comprises a plurality of semiconductor chips 100, that are in direct mechanical contact on a common carrier 10.

Figure 2:
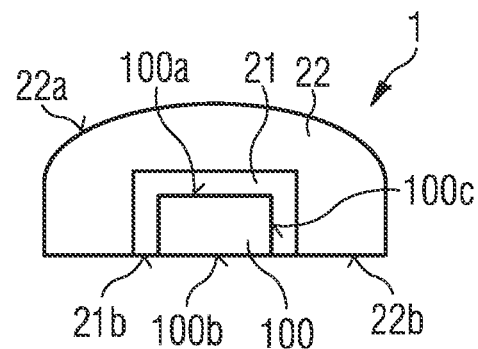
FIG. 2 shows a schematic sectional view of an optoelectronic component without a carrier.

FIG. 2 shows a schematic sectional view of an optoelectronic component, according to a first example. The optoelectronic semiconductor chip 100 has an exposed connection surface 100b, via which the optoelectronic semiconductor chip 100 can be electrically conductively connected and operated. The top surface 100a and the lateral side surfaces 100c connecting the connection surface 100b and the top surface 100a of the optoelectronic semiconductor chip 100 to each other are covered by the first potting body 21. In particular, at these surfaces the optoelectronic semiconductor chip 100 is in direct mechanical contact 100 with the first potting body 21. The bottom surface 21b of the first potting body 21 terminates flush with the connecting surface 100b of the semiconductor chip 100. The second potting body 22 is arranged on the side of the first potting body 21 facing away from the optoelectronic semiconductor chip 100. The second potting body 22 completely covers the sides of the first potting body facing away from the semiconductor chip 100 and is in direct contact therewith. The bottom surface 22b of the second potting body 22 terminates flush with the bottom surface 21b of the first potting body 21. The top surface 22a of the second potting body 22 is convexly curved.

The first potting body 21 comprises, for example, a polymer material, in particular silicone, and a conversion agent. The conversion agent converts the electromagnetic radiation generated during normal use of the optoelectronic semiconductor chip 100, in a radiation of a longer wavelength region. The conversion agent may comprise or consist of phosphor particles, for example. The first potting body 21 is not clear.

The second potting body 22 comprises, for example, a polymer material, in particular silicone. The second potting body 22 is clear. Thus, due to the convex curvature of the top surface 22a, it has the effect of an optical lens.

Figure 3:
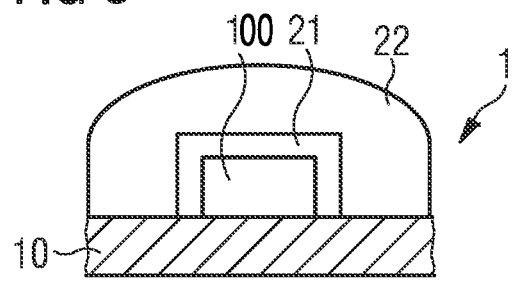
FIG. 3 shows a schematic sectional view of an optoelectronic component with a carrier.

FIG. 3 shows a schematic sectional illustration of an optoelectronic component according to a second example. The optoelectronic component comprises analogous to the optoelectronic component of FIG. 2 to an optoelectronic semiconductor chip 1, a first potting body 21 and a second potting body 22. In addition, the optoelectronic component comprises a carrier 10 arranged at the connection surface 100b and at the bottom surfaces 21b, 22b of the first and the second potting body 21, 22 terminating flush with the connection surface 100b. The carrier 10, for example, may comprise electrical conductor tracks and contact structures for making electrical contact and operating the optoelectronic semiconductor chip 100. In particular, the carrier is a printed circuit board (PCB), a metal core or a ceramic substrate.

Figure 4:
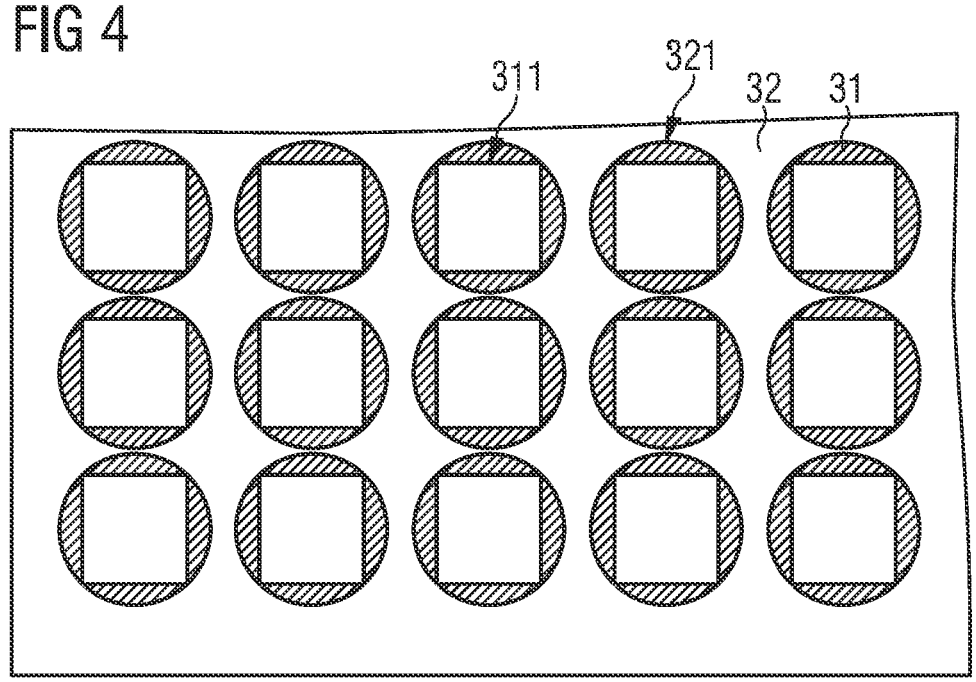
FIG. 4 shows a plan view of the first and second mask from the side facing the carrier during one example of a manufacturing method. The recesses of the first and the second mask are not similar to each other.

FIG. 4 shows a schematic plan view of a first 31 and a second mask 32 from the side which faces the carrier 10 during production of the optoelectronic component. The first mask 31 has square recesses 311 extending perpendicularly to the main extension plane of the first mask 31 completely through this. The recesses 311 of the first mask 31 are arranged in the main extension plane of the first mask 31 at the grid points of a regular grating. The second mask 32 has circular recesses 321, these completely penetrate the second mask 32 perpendicular to the main extension plane of the second mask 32. The recesses 321 in the second mask 32 are arranged along the main extension plane of the second mask at the grid points of a regular grid. The recesses 311, 321 of the first 31 and the second mask 32 are arranged such that each contour of the recesses 311 of the first mask 31 is completely surrounded by a contour of the recesses 321 of the second mask 32 in a lateral plane. The lateral plane is the plane that runs parallel to the main extension direction of the first 31 and second 32 mask.

The first mask 31 has a region provided to insert the second mask 32 in the first mask 31. In the inserted state, the first mask 31 and the second mask 32 are flush with one another on the side facing the carrier 10. In this example, the contours of the recesses 311 of the first mask 31 and the recesses 321 of the second mask 32 are not similar to each other.

Figure 5:
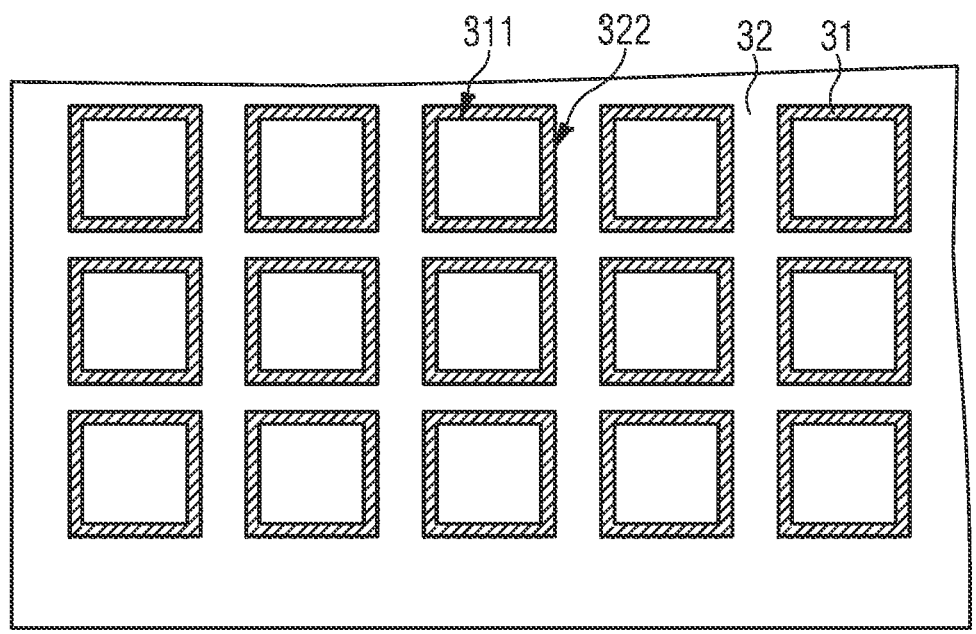
FIG. 5 shows a schematic plan view of a first mask and a second mask from the side facing the carrier during one example of a manufacturing method.

FIG. 5 shows a schematic plan view of an alternative example of the first 31 and the second 32 mask. In contrast to the example of the first 31 and second mask 32 illustrated in FIG. 4, in this example the contours of the recesses 311 of the first mask 31 and 321 of the second mask 32 are similar to one another.

Figure 6A:
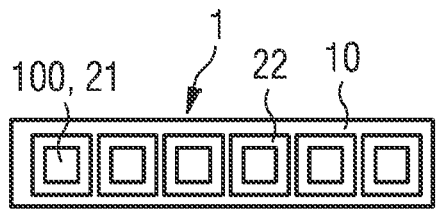
FIGS. 6A, 6B, 6C and 6D each show a schematic plan view of different examples of optoelectronic components with multiple semiconductor chips arranged on a common carrier.

FIG. 6A shows a schematic top view of the top surface of an example of an optoelectronic component 1 comprising a carrier 10 and a multiplicity of semiconductor chips 100. The semiconductor chips 100 are arranged in a lateral plane along a straight line on a surface of the carrier 10 and in each example, as shown in FIG. 3, the semiconductor chips 100 are covered by the first 21 and the second 22 potting body.

The carrier 10 comprises conductor tracks and contact structures by which the semiconductor chips 100 can be contacted and operated in an electrically conductive manner. In addition, the carrier 10 is the mechanically load-bearing component of the optoelectronic component 1. More specifically, the first 21 and the second 21 are fabricated on the carrier 10. Subsequently, the carrier was severed as intended so that an optoelectronic component 1 with six semiconductor chips 100 was created.

Figure 6B:
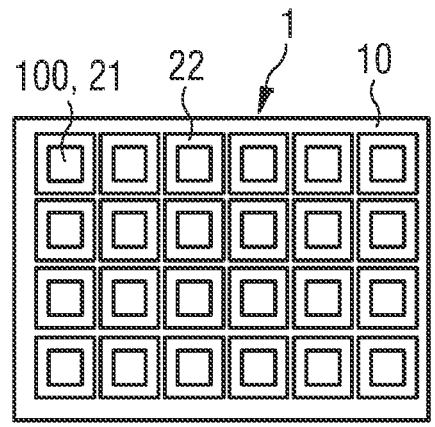

FIG. 6B shows a schematic plan view of the top surface of an optoelectronic component 1 according to a further example. This example differs from the example of FIG. 6A, in that the carrier 10 is severed in a manner so that the optoelectronic component 1 includes a rectangular arrangement of 24 semiconductor chips 100 arranged along a regular grid.

Figure 6C:
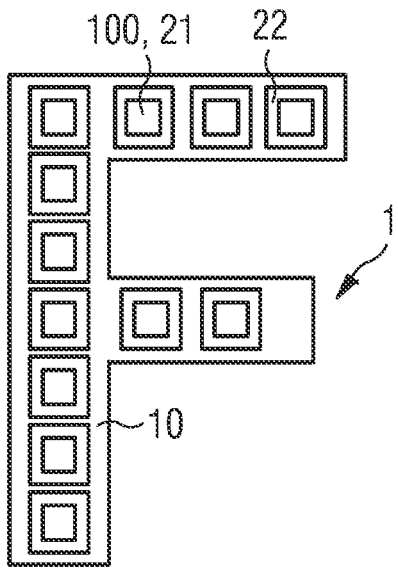

FIG. 6C shows a schematic plan view of the top surface of an optoelectronic component 1 according to a further example. This example differs from the example of FIG. 6A essentially in that the carrier 10 is severed such that the optoelectronic component 1 comprises an F-shaped arrangement of 12 semiconductor chips 100.

Figure 6D:
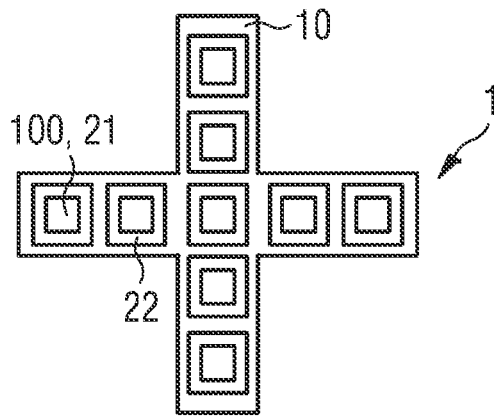

FIG. 6D is a schematic plan view of the top surface of an optoelectronic component 1 according to a further example. This example differs from the example of FIG. 6A essentially in that the carrier 10 is severed such that the optoelectronic component 1 is a cross-shaped arrangement of nine semiconductor chips 100.

Alternatively, the optoelectronic component 1 may have further contours along its main extension plane, along which the carrier 10 is separated.

Overall, it is possible to perform by appropriate separation here described components in different forms that emulate, for example, letters, symbols or pictograms.

Our components and methods are not limited by the description based on the examples. Rather, this disclosure encompasses any novel feature as well as any combination of features, which includes in particular any combination of features in the appended claims, even if the feature or combination itself is not explicitly stated in the claims or examples.

This application claims priority of DE 102016108931.1, the subject matter of which is incorporated herein by reference.

The invention claimed is:
1. An optoelectronic component comprising:
an optoelectronic semiconductor chip comprising a connection surface, a cover surface opposite the connection surface and lateral side surfaces that connect the connection surface and the cover surface to one another;
a first potting body; and
a second potting body,
wherein the first potting body covers all lateral side surfaces and the top surface of the semiconductor chip, the first potting body has a bottom surface flush with the connection surface of the semiconductor chip, the second potting body has a bottom surface flush with the bottom surface of the first potting body, the second potting body completely covers all side surfaces of the first potting body facing away from the semiconductor chip, a top surface of the second potting body on the opposite of the connection surface is convexly curved, the first and second potting bodies have a contour in a lateral plane that is not similar, the optoelectronic semiconductor chip has exclusively on its connection surface exposed electrical contact surfaces via which the semiconductor chip is electrically connectable and operable, and the first potting body includes at least one conversion agent that at least partially converts electromagnetic radiation generated in the semiconductor chip into electromagnetic radiation of a longer wavelength.

2. The optoelectronic component according to claim 1, further comprising a carrier that is in places in direct contact with the first potting body and the second potting body, wherein the carrier is connected to the first potting body and the second potting body without a binding agent.

3. The optoelectronic component according to claim 1, wherein the optoelectronic semiconductor chip, the first potting body and the second potting body are freely accessible on a lower side of the optoelectronic component.

4. The optoelectronic component according to claim 1, wherein the second potting body is clear.

5. The optoelectronic component according to claim 1, wherein the first potting body is in direct contact with the semiconductor chip.

6. The optoelectronic component according to claim 1, wherein the first and the second potting body connect to each other without a binding agent.

7. The optoelectronic component according to claim 1, which is free of a carrier.

8. The optoelectronic component according to claim 2, wherein the carrier forms a heat sink for the optoelectronic component.

9. The optoelectronic component according to claim 1, wherein the optoelectronic component comprises a multiplicity of semiconductor chips mechanically connected to one another, and each semiconductor chip is assigned exactly one first potting body and exactly one second potting body.

10. An optoelectronic component comprising:
an optoelectronic semiconductor chip comprising a connection surface, a cover surface opposite the connection surface and lateral side surfaces that connect the connection surface and the cover surface to one another;
a first potting body;
a second potting body; and
a carrier,
wherein the first potting body covers all lateral side surfaces and the top surface of the semiconductor chip,
the first potting body has a bottom surface flush with the connection surface of the semiconductor chip,
the second potting body has a bottom surface flush with the bottom surface of the first potting body,
the second potting body completely covers all the side surfaces of the first potting body facing away from the semiconductor chip,
a top surface of the second potting body on the opposite of the connection surface is convexly curved,
the first and second potting bodies have a contour in the lateral plane that is not similar,
the optoelectronic semiconductor chip has exclusively on its connection surface exposed electrical contact surfaces via which the semiconductor chip is electrically connectable and operable,
the carrier is in places in direct contact with the first potting body and the second potting body, and
the carrier forms a heat sink for the optoelectronic component.

11. An optoelectronic component comprising:
a multiplicity of optoelectronic semiconductor chips each comprising a connection surface, a cover surface opposite the connection surface and lateral side surfaces that connect the connection surface and the cover surface to one another;
a multiplicity of first potting bodies; and
a multiplicity of second potting bodies,
wherein the semiconductor chips are mechanically connected to one another,
each semiconductor chip is assigned exactly one first potting body and exactly one second potting body,
each first potting body covers all lateral side surfaces and the top surface of the associated semiconductor chip,
each first potting body has a bottom surface flush with the connection surface of the associated semiconductor chip,
each second potting body has a bottom surface flush with the bottom surface of the associated first potting body,
each second potting body completely covers all the side surfaces of the associated first potting body facing away from the semiconductor chip,
a top surface of each second potting body on the opposite of the associated connection surface is convexly curved,
each first and second potting bodies have a contour in the lateral plane that is not similar, and
each optoelectronic semiconductor chip has exclusively on its connection surface exposed electrical contact surfaces via which the semiconductor chip is electrically connectable and operable.

* * * * *